United States Patent
Ko

(10) Patent No.: US 8,089,124 B2
(45) Date of Patent: Jan. 3, 2012

(54) LATERAL DMOS DEVICE AND METHOD FOR FABRICATING THE SAME

(75) Inventor: Choul-Joo Ko, Bundang-gu (KR)

(73) Assignee: Dongbu HiTek Co., Ltd., Seoul (KR)

( * ) Notice: Subject to any disclaimer, the term of this patent is extended or adjusted under 35 U.S.C. 154(b) by 409 days.

(21) Appl. No.: 12/141,961

(22) Filed: Jun. 19, 2008

(65) Prior Publication Data

US 2009/0001461 A1    Jan. 1, 2009

(30) Foreign Application Priority Data

Jun. 26, 2007    (KR) .................. 10-2007-0062849

(51) Int. Cl.
*H01L 29/66*    (2006.01)
*H01L 21/336*    (2006.01)

(52) U.S. Cl. ........ 257/342; 257/341; 257/343; 257/335; 257/E29.256; 438/197; 438/289; 438/291

(58) Field of Classification Search ............... 257/335, 257/E29.261, 341–343, E29.256; 438/197, 438/289, 291

See application file for complete search history.

(56) References Cited

U.S. PATENT DOCUMENTS

| 6,946,705 | B2 * | 9/2005 | Kitaguchi ............... 257/335 |
| 6,977,425 | B2 * | 12/2005 | Yoshida et al. ............ 257/517 |
| 7,436,024 | B2 * | 10/2008 | Kumagai et al. ........... 257/335 |
| 7,635,621 | B2 * | 12/2009 | McCormack et al. ...... 438/202 |

FOREIGN PATENT DOCUMENTS

CN    1841741    10/2006

* cited by examiner

*Primary Examiner* — Kenneth Parker
*Assistant Examiner* — Jose R Diaz
(74) *Attorney, Agent, or Firm* — Sherr & Vaughn, PLLC

(57) ABSTRACT

An LDMOS device and a method for fabricating the same that may include a first conductivity-type semiconductor substrate having an active area and a field area; a second conductivity-type deep well formed on the first conductivity-type semiconductor substrate; a second conductivity-type adjusting layer located in the second conductivity-type deep well; a first conductivity-type body formed in the second conductivity-type deep well; an insulating layer formed on the first conductivity-type semiconductor substrate in the active area and the field area; a gate area formed on the first conductivity-type semiconductor substrate in the active area; a second conductivity-type source area formed in the first conductivity-type body; a second conductivity-type drain area formed in the second conductivity-type deep well. Accordingly, such an LDMOS device has a high breakdown voltage without an increase in on-resistance.

18 Claims, 8 Drawing Sheets

LATERAL DMOS DEVICE AND METHOD FOR FABRICATING THE SAME

The present application claims priority under 35 U.S.C. §119 to Korean Patent Application No. 10-2007-0062849 (filed Jun. 26, 2007), which is hereby incorporated by reference in its entirety.

BACKGROUND

A bipolar-CMOS-DMOS (BCD) process is a system-on-chip (SOC) technique used generally in automotive applications, a printer head driver, a monitor control, etc. An LDMOS can be used as a main device in the BCD process, and can be used mainly in a power integrated circuit (PIC). An LDMOS device can have a high input impedance compared with a bipolar transistor, and thus, can have a large power gain and a simple gate driving circuit. Furthermore, since the LDMOS device is a unipolar device, there is no time delay caused by storage or recombination of minority carriers while the device is turned off.

Figure 1:
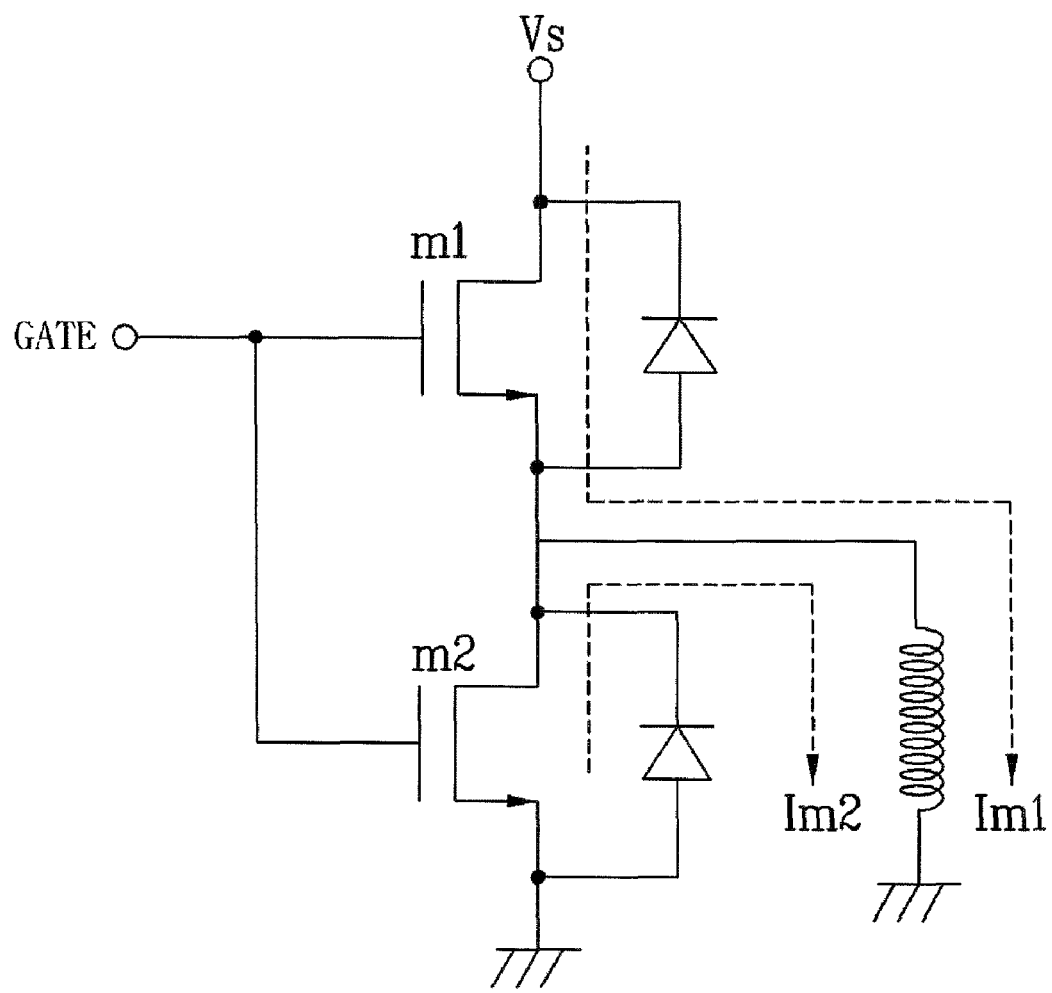

As illustrated in example FIG. 1, provided is a push-pull or bridge structure having LDMOS devices m1 and m2 which drives inductor loads. Diodes indicate body diodes of the LDMOS devices. LDMOS devices m1 and m2 drive the inductor loads through current routes Im1 and Im2. Hereinafter, LDMOS m1 is referred to as a high side LDMOS, and LDMOS m2 is referred to as a low side LDMOS.

Figure 2:
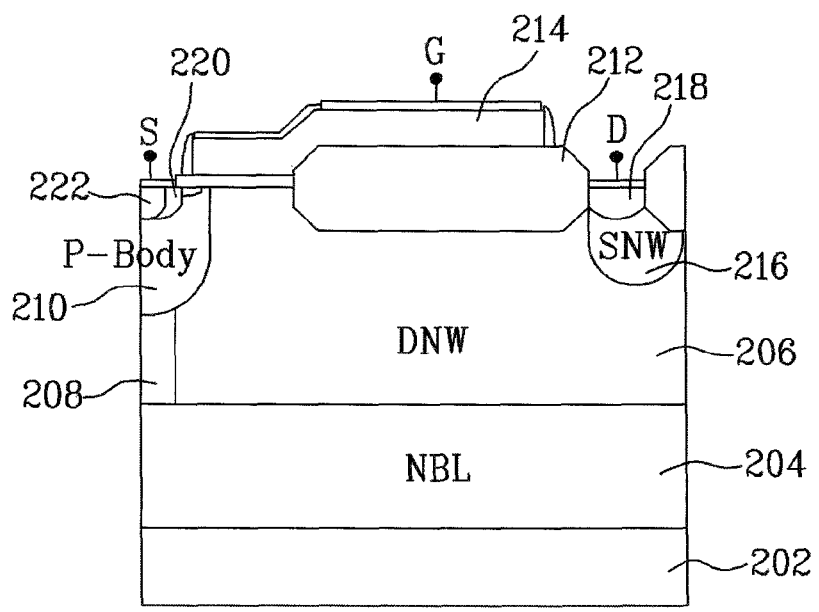

As illustrated in example FIG. 2, a general high side LDMOS is provided including P-type semiconductor substrate 202 having N-type buried layer 204 formed thereon and/or thereover, and a P-type epitaxial layer. N-type buried layer 204 can serve to reduce the width of a depletion layer extended from P-type body 210, and thus, to substantially raise a punch-through voltage when a voltage is applied to N$^+$-type drain area 218. Further, the P-type epitaxial layer, when semiconductor crystals in a gas state are extracted on a single crystal wafer serving as a substrate, serves to allow the crystals to be grown along the crystal axis of P-type substrate 202 and to reduce the resistance of P-type substrate 202. Thereafter, N-type deep well 206 is formed on and/or over P-type semiconductor substrate 202 and deep well cutout area 208 is formed by coating P-type semiconductor substrate 202 with a mask when ion implantation for forming N-type deep well 206 is performed. P-type body 210 is formed in N-type deep well 206. A channel area is formed around the surface of P-type body 210 between a contact surface between P-type body 210 and N-type deep well 206 and N$^+$-type source area 220 by applying a bias voltage to gate area 214. Deep well cutout area 208 is formed by coating P-type semiconductor substrate 202 with a mask when ion implantation for forming N-type deep well 206 is performed, and thus, serves to raise a breakdown voltage when a high voltage is applied to N$^+$-type drain area 218 on condition that the high side LDMOS is turned on. Thereafter, insulating layer 212 is formed at an active area and a field area and includes a field oxide film, such as silicon oxide film, which is thermally grown. Thereafter, gate area 214 is formed and shallow N-type well 216, N$^+$-type source area 220, N$^+$-type drain area 218 and P$^+$-type impurity layer 222 for enhancing a contact with P-type body 210 are formed.

The high side LDMOS device limits an operation voltage so as to avoid the generation of breakdown when the device is turned on. When the operation voltage is raised, the electric field of a gate edge is raised, a body current is increased, and the capacity of a long term safe operating area (SOA) is degraded. Accordingly, it is difficult to implement an LDMOS having a higher operating voltage in a BCD process. In order to raise the breakdown voltage, a method can be used in which the thickness of the P-type epitaxial layer is increased and the width of deep well cutout area 208 is widened. However, this method also results in an increase in the on-resistance (Rsp) of the LDMOS device, and thus, is not proper for the increase in the overall usefulness of the LDMOS device.

SUMMARY

Embodiments relate to a semiconductor device, and more particularly, to a lateral double diffused MOSFET (hereinafter, referred to as "LDMOS") and a method for fabricating the same in which an N-type adjusting layer is newly added to: increase the thickness of a P-type epitaxial layer, widen the width of a deep well cutout area and raise a breakdown voltage, while not reducing an on-resistance property of the LDMOS device.

Embodiments relate to a lateral DMOS device having an active area and a field area are defined on and/or over a first conductivity-type semiconductor substrate and may include at least one of the following steps: forming a second conductivity-type deep well and a second conductivity-type adjusting layer located in the second conductivity-type deep well on and/or over the first conductivity-type semiconductor substrate; and then forming a first conductivity-type body in the second conductivity-type deep well; and then forming an insulating layer at the active area and the field area; and then forming a gate area at the active area; and then forming a second conductivity-type source area in the first conductivity-type body and forming a second conductivity-type drain area in the second conductivity-type deep well.

Embodiments relate to a lateral DMOS device that may include at least one of the following steps: providing a first conductivity-type semiconductor substrate having an active area and a field area; and then forming a second conductivity-type deep well on the first conductivity-type semiconductor substrate; and then forming a second conductivity-type adjusting layer located in the second conductivity-type deep well on the first conductivity-type semiconductor substrate; and then forming a first conductivity-type body in the second conductivity-type deep well; and then forming an insulating layer on the first conductivity-type semiconductor substrate in the active area and the field area; and then forming a gate area on the first conductivity-type semiconductor substrate in the active area; and then forming a second conductivity-type source area in the first conductivity-type body; and then forming a second conductivity-type drain area in the second conductivity-type deep well.

Embodiments relate to an LDMOS device having an active area and a field area defined on and/or over a first conductivity-type semiconductor substrate, and may include at least one of the following: a second conductivity-type deep well formed on and/or over the first conductivity-type semiconductor substrate; a second conductivity-type adjusting layer located in the second conductivity-type deep well; a first conductivity-type body formed in the second conductivity-type deep well; an insulating layer formed at the active area and the field area; a gate area formed at the active area; and a second conductivity-type source area formed in the first conductivity-type body, and a second conductivity-type drain area formed in the second conductivity-type deep well. In accordance with embodiments, although the first conductivity-type is a P-type and the second conductivity-type is an N-type, the first conductivity-type may be an N-type and the second conductivity-type may be a P-type.

Embodiments relate to an LDMOS device that may include at least one of the following: a first conductivity-type semiconductor substrate having an active area and a field area; a second conductivity-type deep well formed on the first conductivity-type semiconductor substrate; a second conductivity-type adjusting layer located in the second conductivity-type deep well; a first conductivity-type body formed in the second conductivity-type deep well; an insulating layer formed on the first conductivity-type semiconductor substrate in the active area and the field area; a gate area formed on the first conductivity-type semiconductor substrate in the active area; a second conductivity-type source area formed in the first conductivity-type body; and a second conductivity-type drain area formed in the second conductivity-type deep well.

DRAWINGS

Example FIGS. 1 and 2 illustrate a push-pull or bridge structure having LDMOS devices, which drives inductor loads and a high side LDMOS.

Figure 3A:
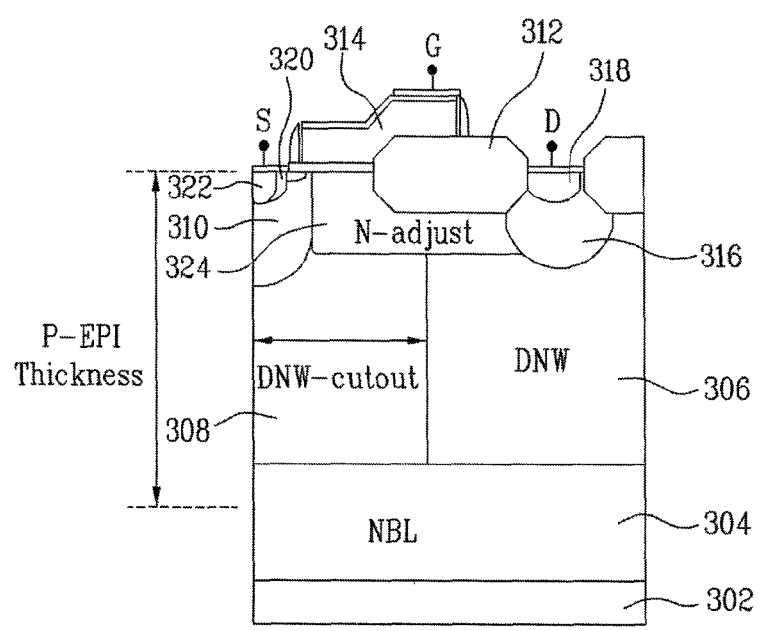
Figure 3B:
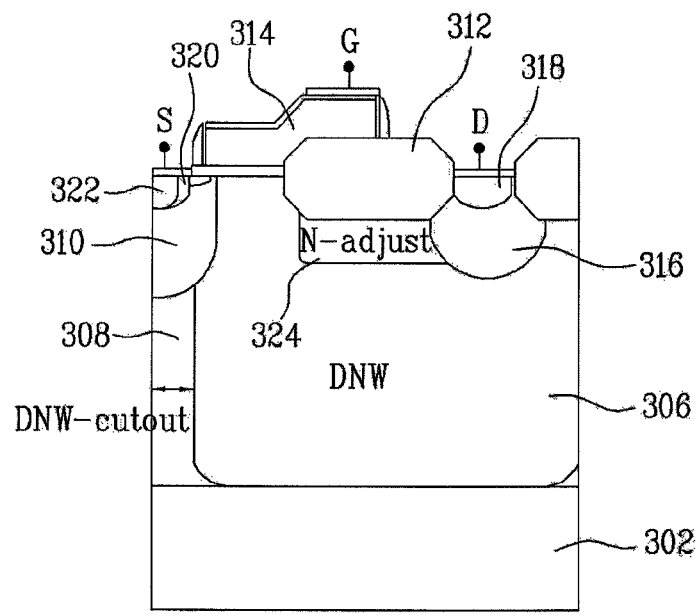

Example FIGS. 3A and 3B illustrate a high side LDMOS and a low side LDMOS, respectively, in accordance with embodiments.

Example FIGS. 4A to 4D illustrate a high side LDMOS having a 85V operation voltage, in accordance with embodiments.

Figure 5A:
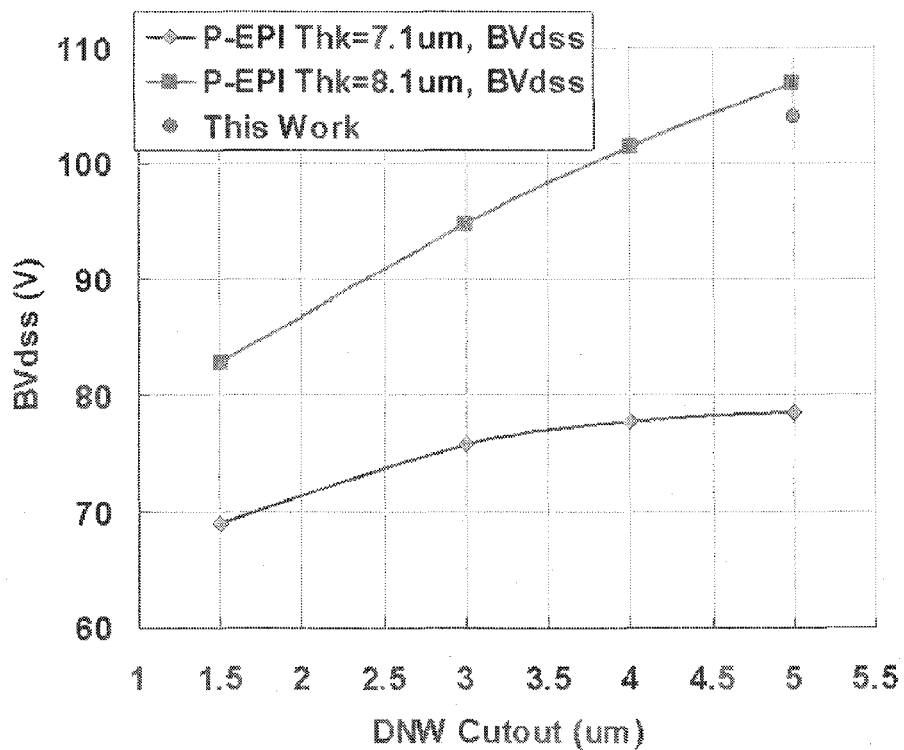
Figure 5B:
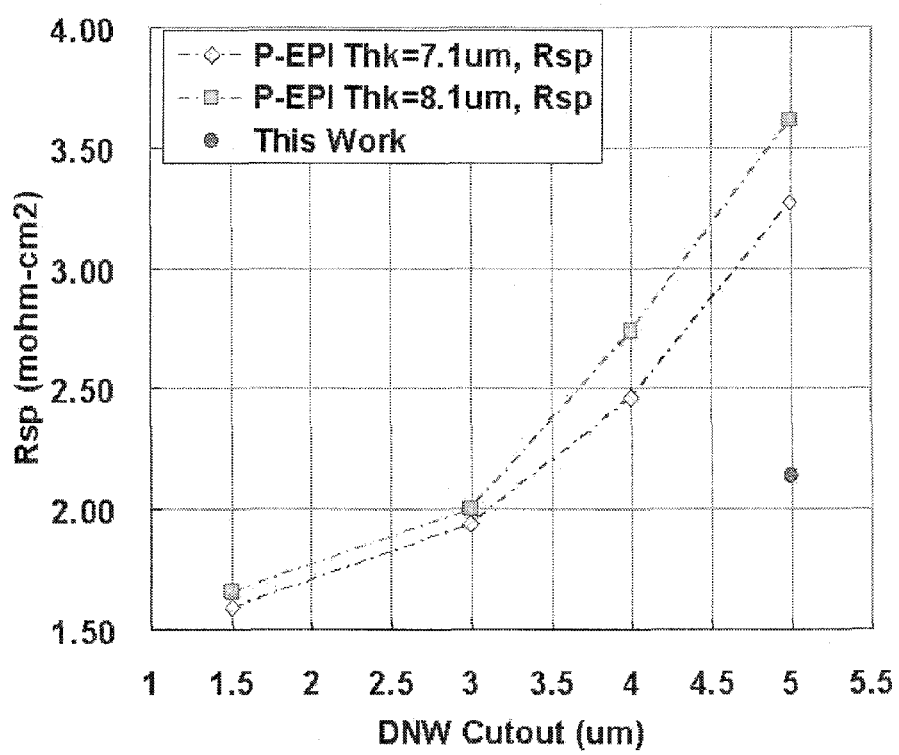

Example FIGS. 5A and 5B illustrate graphs comparing a variation of breakdown voltage and a variation of on-resistance according to a variation of the width of a deep well cutout area in a high side LDMOS device and a high side LDMOS device in accordance with embodiments.

Figure 6:
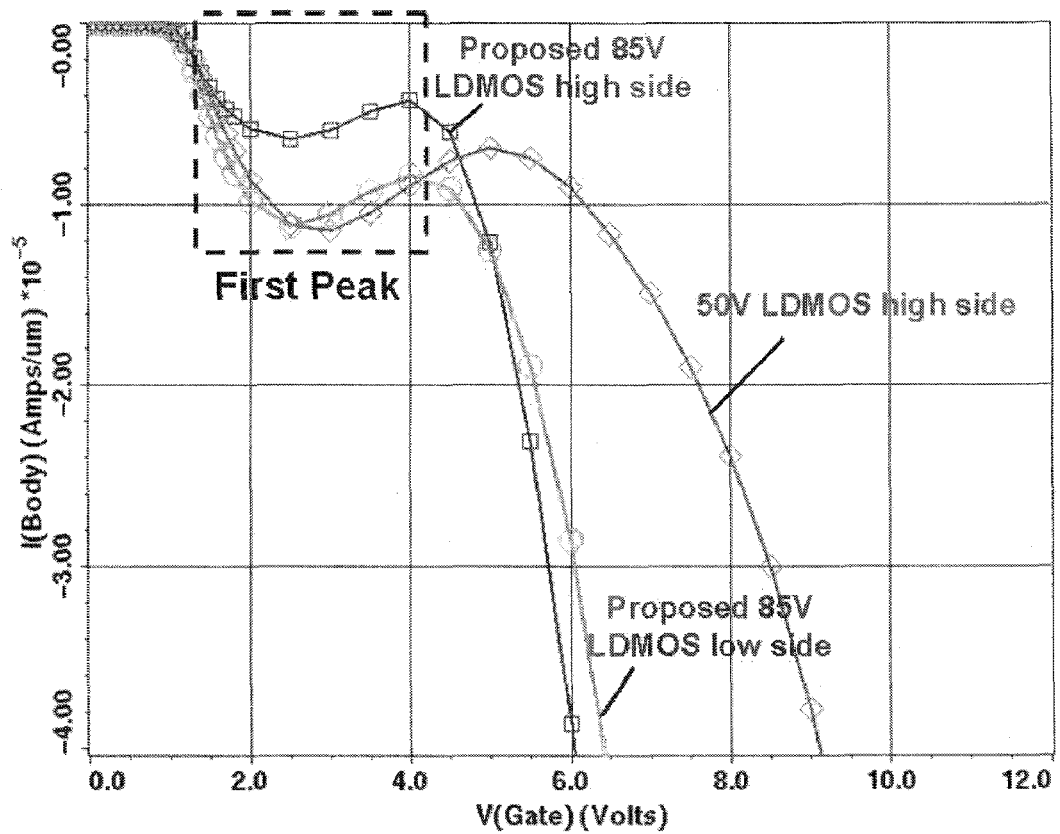

Example FIG. 6 illustrates a graph comparing body currents of a high side LDMOS device having a 50V operation voltage and a high side LDMOS and a low side LDMOS having a 85V operation voltage in accordance with embodiments.

DESCRIPTION

Reference will now be made in detail to the preferred embodiments of the present invention, examples of which are illustrated in the accompanying drawings. Wherever possible, the same reference numbers will be used throughout the drawings to refer to the same or like parts.

As illustrated in example FIG. 3A, a high side LDMOS in accordance with embodiments may include P-type semiconductor substrate 302 having N-type buried layer 304 formed thereon and/or thereover and a P-type epitaxial layer having thickness P-EPI. N-type buried layer 304 may serve to reduce the width of a depletion layer extended from P-type body 310, and thus, may substantially raise a punch-through voltage when a voltage is applied to $N^+$-type drain area 318. The P-type epitaxial layer may serve to reduce the resistance of substrate 302.

N-type deep well 306 may then be formed on and/or over P-type semiconductor substrate 302. Deep well cutout area 308 may be formed on and/or over substrate 3012 adjacent to N-type deep well 306 by coating P-type semiconductor substrate 302 with a mask when ion implantation forming N-type deep well 306 is performed. Meaning, deep well cutout area 308 may be formed by coating P-type semiconductor substrate 302 with a mask when ion implantation for forming N-type deep well 306 is performed, and thus, serves to raise a breakdown voltage when a high voltage is applied to the $N^+$-type drain area 318 on condition that the high side LDMOS is turned on. P-type body 310 may be formed in N-type deep well 306 and may also be formed in deep well cutout area 308 formed on the inside of N-type deep well 306. In order to raise a breakdown voltage, deep well cutout area 308 may have a width larger than that of an LDMOS device having the same on-resistance. Thus, deep well cutout area 308 in accordance with embodiments may become a low-concentration P-type, while a deep well cutout area having a small width becomes an N-type. A channel area may be formed around the surface of P-type body 310 between a contact surface between P-type body 310 and N-type adjusting layer 324 and $N^+$-type source area 320 by applying a bias voltage to gate area 314. N-type adjusting layer 324 may be formed by performing ion implantation after the ion implantation for forming N-type deep well 306 is performed and then by performing a drive-in or diffusion process. Thereafter, insulating layer 312 may be formed at an active area and a field area and gate area 214 formed at the active area. Shallow N-type well 316 and $N^+$-type drain area 318 may be formed in N-type deep well 306. $N^+$-type source area 320 may be formed in P-type body 310 and $P^+$-type impurity layer 322 for enhancing a contact with P-type body 310 may be formed.

In order to raise a breakdown voltage a method in which the thickness of the P-type epitaxial layer is increased and the width of a deep well cutout area is widened compared with a method for fabricating an LDMOS having the same operation voltage. However, this method results in an increase in the on-resistance (Rsp) of the LDMOS device. Accordingly, in accordance with embodiments is a method in which P-EPI Thickness of the P-type epitaxial layer is increased and the width of deep well cutout area 308 is widened so as to raise the breakdown voltage and N-type adjusting layer 324 is added so as to lower the on-resistance of the LDMOS device. In accordance with embodiments, N-type adjusting layer 324 may be added to an LDMOS device having an operation voltage between 40 to 60, preferably 50V. The P-type epitaxial layer may have a thickness of between 7.0 to 7.2, preferably 7.1 μm and deep well cutout area 308 may have a width of 0 to 2, preferably 1.5 μm. Moreover, in accordance with embodiments, the LDMOS device may have an operation voltage between 70 to 90, preferably 85V, the P-type epitaxial layer may have a thickness of between 7.5 to 8.0, preferably 7.6 μm, and deep well cutout area 308 may have a width of between 3 to 5, preferably 4 μm so as to raise a breakdown voltage in comparison with an LDMOS having a 50V operation voltage without increasing the on-resistance of the LDMOS device.

As illustrated in example FIG. 3B, a low side LDMOS in accordance with embodiments may include N-type adjusting layer 324 and other parts having the same functions and structures as those of the high side LDMOS illustrated in example FIG. 3A. However, N-type buried layer 304 is omitted and deep well cutout area 308 has a smaller width than that of the high side LDMOS.

As illustrated in example FIGS. 4A to 4D, in accordance with embodiments, a method of forming a high side LDMOS having an operation voltage of between 70 to 90, preferably 85V may include providing P-type semiconductor substrate 402 having N-type buried layer 404 formed thereon and a P-type epitaxial layer having a thickness P-EPI. Thickness P-EPI Thickness of P-type epitaxial layer may be between 7.5 to 8.0, preferably 7.6 μm. Thereafter, N-type deep well 406 may be formed on and/or over P-type semiconductor substrate 402, and deep well cutout area 408 may be formed by coating P-type semiconductor substrate 402 with a mask when ion implantation is performed for forming N-type deep well 406. Deep well cutout area 408 has width DNW-cutout of between 3 to 5 μm, preferably 4 μm. N-type deep well 406 may be formed by performing ion implantation using phosphorus (P) under conditions of a concentration of between 2.5E12 to 4.0E12 ion/cm$^2$, preferably 3.4E12 ion/cm$^2$, and a power of between 800 to 1000 KeV, preferably 900 KeV.

Figure 4A:
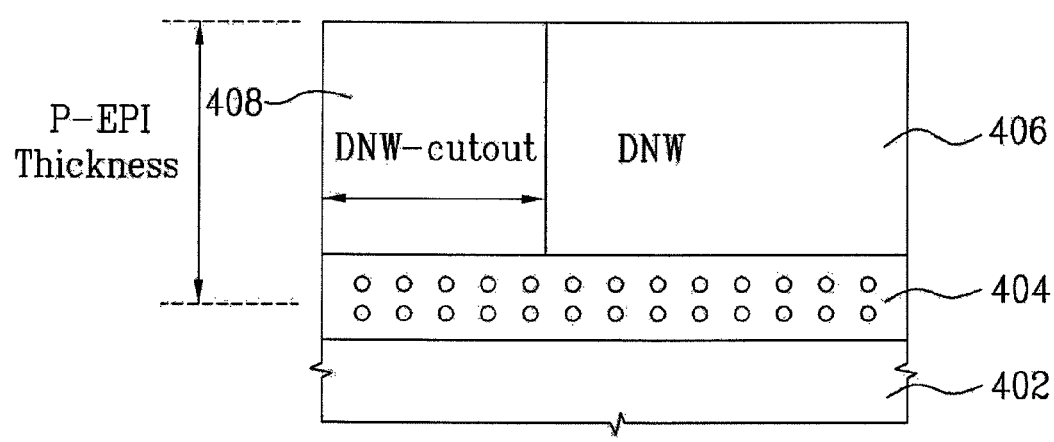
Figure 4B:
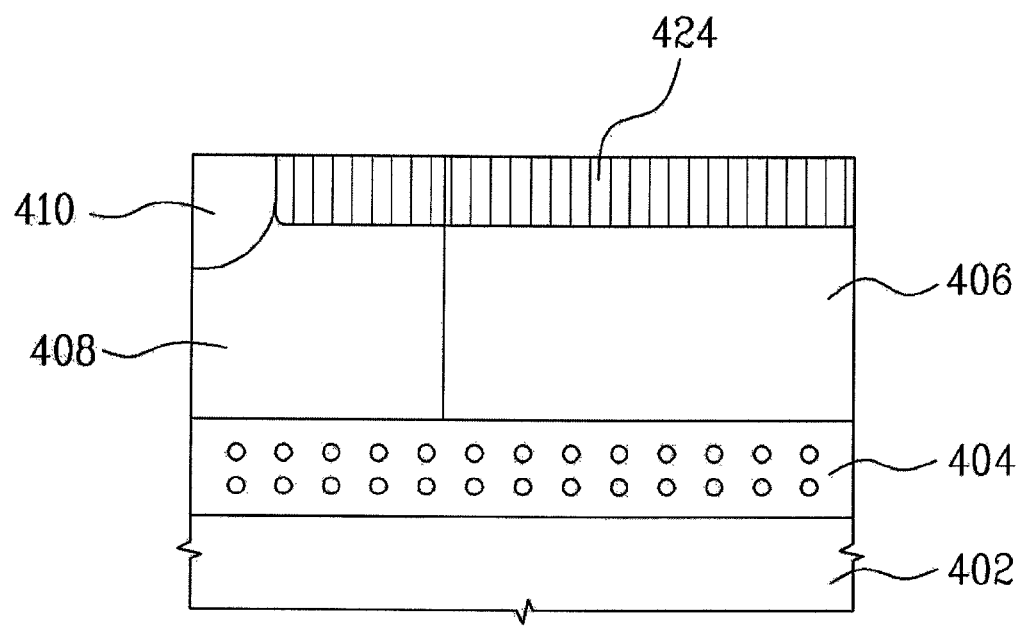

As illustrated in example FIG. 4B, N-type adjusting layer 424 may be formed by performing an ion implantation using arsenic (As) and then by performing a drive-in or diffusion process. The ion implantation may be performed under conditions of a concentration of between 0.5E12 to 1.5E12 ion/cm$^2$, preferably 1.0E12 ion/cm$^2$, and a power of between 100 to 200 KeV, preferably 135 KeV. N-type adjusting layer 424 may be formed after the ion implantation for forming N-type deep well 406. Preferably, N-type deep well 406 as well as N-type adjusting layer 424 may be diffused to a predetermined or desired depth through the drive-in or diffusion process, and thus, the formation of N-type deep well 406 and N-type adjusting layer 424 are completed simultaneously. P-type body 410 may be formed in N-type deep well 406 and/or deep well cutout area 408 of N-type deep well 406. P-type body 410 may be formed by performing ion implantation using boron (B) under conditions of a concentration of between 1.0E13 to 3.0E13 ion/cm$^2$, preferably 2.5E13 ion/cm$^2$, and a power of between 10 to 100 KeV, preferably 50 KeV, performing a hard bake process without removing a photoresist used in the above boron ion implantation, and then performing ion implantation using arsenic (As) under conditions of a concentration of between 5.0E13 to 1.0E14 ion/cm$^2$, preferably 7.5E13 ion/cm$^2$ and a power of between 100 to 200 KeV, preferably 160 KeV.

Figure 4C:
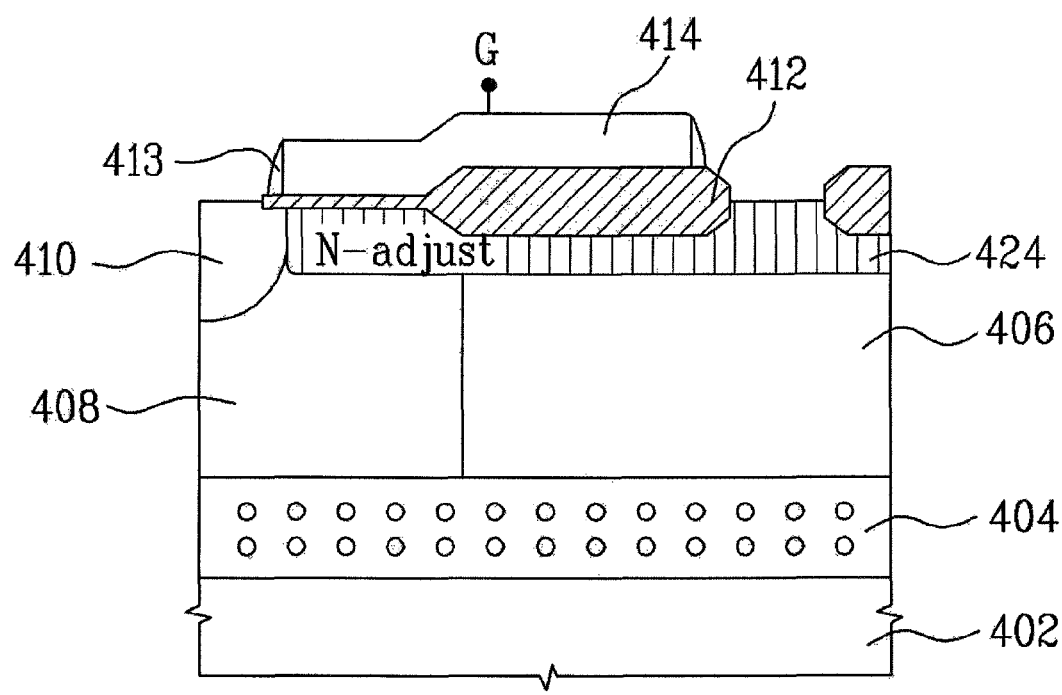

As illustrated in example FIG. 4C, insulating layer 412 may then be formed at an active area and a field area of substrate 402. Gate area 414 may then be formed on and/or over the surface of P-type semiconductor substrate 402 including insulating layer 412. Insulating layer 412 may include a field oxide film, such as silicon oxide, which is thermally grown. Gate area 414 may extend from the uppermost surface of a portion of N$^+$-type source area 420, which will be formed later, to the uppermost surface of insulating layer 412, and include polysilicon doped with impurities. Gate area 414 may be isolated from the surface of P-type semiconductor substrate 402 by a gate dielectric that is composed of an oxide, a nitride, or compounds thereof i.e., a stacked nitride/oxide (NO layer) or oxide/nitride/oxide (ONO layer). Sidewall area 413 may be formed on the sidewall of a gate electrode at gate area 414. Sidewall area 413 may be composed of an oxide, such as silicon oxide, or a nitride, such as silicon nitride.

Figure 4D:
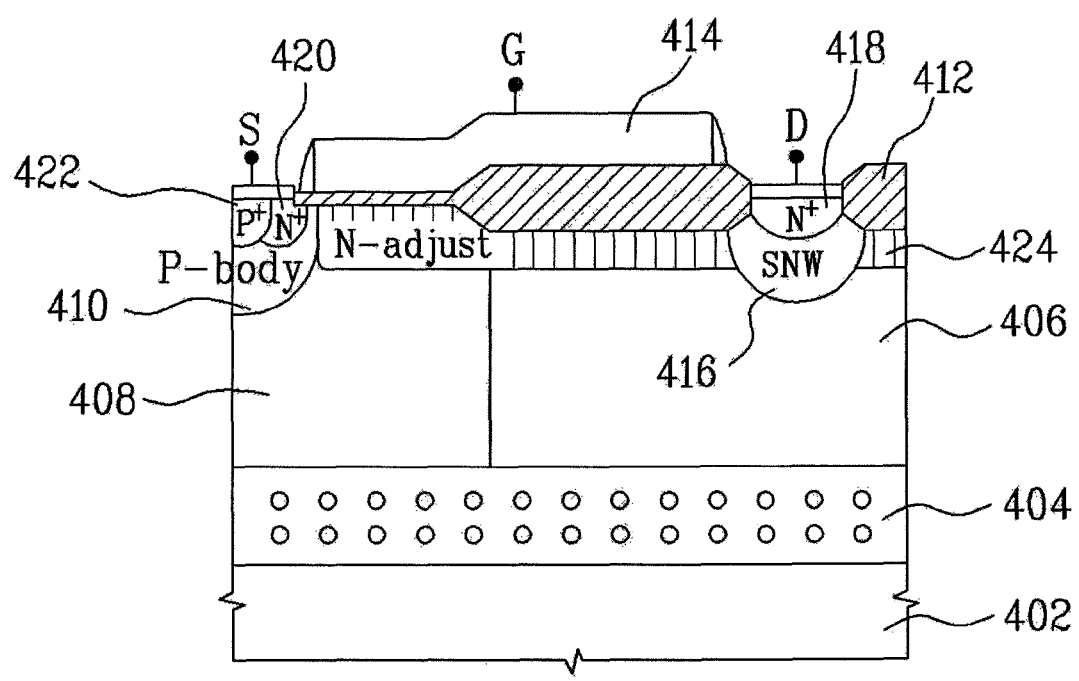

As illustrated in example FIG. 4D, shallow N-type well 416 may then be formed by performing ion implantation using phosphorous (P). N$^+$-type source area 420 and N$^+$-type drain area 418 may be formed by performing ion implantation using phosphorous (P) or arsenic (As). P$^+$-type impurity layer 422 for enhancing a contact with P-type body 410 may be formed.

As illustrated in example FIGS. 5A and 5B, graphs comparing a variation of breakdown voltage and a variation of on-resistance R$_{sp}$ according to a variation of the width of deep well cutout area 408 in a high side LDMOS device in accordance with embodiments and those in a comparative or general LDMOS device, respectively.

As illustrated in example FIG. 5A, the horizontal axis represents width DNW cutout measured in μm of deep well cutout area 408 while the vertical axis represents a breakdown voltage (BV$_{dss}$) measured in Volts. In accordance with embodiments, in order to raise the breakdown voltage, the P-type epitaxial layer may have thickness P-EPI Thk of between 7.5 to 8.0 μm, preferably 7.6 μm and deep well cutout area 408 may have a varied width DNW cutout. Moreover, in comparison with embodiments, the case (hereinafter referred to as "comparative Example 1") of a P-type epitaxial layer having thickness P-EPI Thk of between 7.0 to 7.2 μm, preferably 7.1 μm, and the case (hereinafter referred to as "comparative Example 2") of a P-type epitaxial layer having thickness P-EPI Thk of between 7.5 to 8.0 μm, preferably 7.6 μm are illustrated.

As the above test result, since the thickness of the P-type epitaxial layer was increased, in case that width DNW cutout of deep well cutout area 408 is between 3 to 5 μm, preferably 4 μm, the breakdown voltage in the high side LDMOS device in accordance with embodiments may be maximally raised to between 98 to 105 V, preferably 104V, which is higher than the breakdown voltage in the comparative Example 1.

As illustrated in example FIG. 5B, the horizontal axis represents width DNW cutout of deep well cutout area 408 measured in μm and the vertical axis represents on-resistance R$_{sp}$ of the LDMOS device measured in mΩ/cm$^2$. In the LDMOS device of the comparative Example 2, since the thickness of the P-type epitaxial layer is between 7.5 to 8.0 μm, preferably 7.6 μm and width DNW cutout of deep well cutout area 408 is between 3 to 5 μm, preferably 4 μm, the breakdown voltage may be high and on-resistance R$_{sp}$ is between 2.0 to 2.5 mΩ/cm$^2$, preferably 2.3 mΩ/cm$^2$) is also high. However, in the LDMOS device of the comparative Example 1, the breakdown voltage is lower than that in the LDMOS device of the comparative Example 2, but on-resistance R$_{sp}$ is low. The larger width DNW cutout of deep well cutout area 408 or thickness P-EPI Thk of the P-type epitaxial layer, results in an increase in both the breakdown voltage and the on-resistance.

The high side LDMOS device in accordance with embodiments has a large width DNW cutout of between 3 to 5 μm, preferably 4 μm for N-type deep well cutout area 408 and a large thickness P-EPI Thk of between 7.5 to 8.0 μm, preferably 7.6 μm for the P-type epitaxial layer, but a high breakdown voltage. This is similar to that of the LDMOS device in the comparative Example 2. The high side LDMOS device in accordance with embodiments also has an on-resistance of between 1.4 to 1.8 mΩ/cm$^2$, preferably 1.64 mΩ/cm$^2$, which is lower than that of the LDMOS devices in the comparative Example 1 or comparative Example 2. The reason is that the on-resistance is relatively reduced by the addition of doped N-type adjusting layer 424.

Accordingly, an LDMOS device typically having a P-type epitaxial layer with a thickness of between 7.0 to 7.2 μm, preferably 7.1 μm and deep well cutout area with a width of between 0 to 2 μm, preferably 1.5 μm, a breakdown voltage of between approximately 60 to 80 V, preferably 70V, and an operation voltage of between approximately 40 to 60 V, preferably 50V, may be modified in accordance with embodiments to have a P-type epitaxial with a thickness of between 7.5 to 8.0 μm, preferably 7.6 μm, a deep well cutout area width of between 3 to 5 μm, preferably 4 μm and an N-type adjusting layer. Such a modification may result in a greatly enhanced LDMOS device having a breakdown voltage of between approximately 98 to 105 V, preferably 100V, and an operation voltage of between approximately 70 to 90 V, preferably 85V, while preventing an increase in on-resistance.

As illustrated in example FIG. 6, a graph comparing body currents of a high side LDMOS and a low side LDMOS produced in accordance with embodiments and having the afore-described characteristics with a body current of a general high side LDMOS device having a operation voltage of between 40 to 60V, preferably 50V. The horizontal axis represents a gate voltage measured in Volts while the vertical axis represents a body current measured in 10E-5 Amps/μm. The body currents of the LDMOS devices made in accordance with embodiments at a first peak is lower than that of the high side LDMOS device. Meaning, the structure of the LDMOS in accordance with embodiments lowers the first peak value of the body current while having a high breakdown voltage but no increase in on-resistance.

As described above, in an LDMOS device and a method for fabricating the same in accordance with embodiments, a deep well cutout area may have a large width and an epitaxial layer may have a large thickness so as to raise a breakdown voltage, and a doped adjusting layer may be additionally formed so as to prevent an increase in on-resistance of the LDMOS device. Further, the addition of the adjusting layer may be achieved under a normal process, and thus, makes possible the formation of an LDMOS device having a high operation voltage even through the same process as existing processes.

Although embodiments have been described herein, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method comprising:
   providing a first conductivity-type semiconductor substrate having an active area and a field area; and then
   forming a second conductivity-type deep well on the first conductivity-type semiconductor substrate; and then
   forming a second conductivity-type adjusting layer located in the second conductivity-type deep well on the first conductivity-type semiconductor substrate; and then
   forming a first conductivity-type body in the second conductivity-type deep well; and then
   forming an insulating layer on the first conductivity-type semiconductor substrate in the active area and the field area; and then
   forming a gate area on the first conductivity-type semiconductor substrate in the active area; and then
   forming a second conductivity-type source area in the first conductivity-type body; and then
   forming a second conductivity-type drain area in the second conductivity-type deep well,
   wherein forming the second conductivity-type deep well comprises:
   simultaneously forming a deep well cutout area by coating the first conductivity-type semiconductor substrate with a mask when performing the ion implantation for forming the second conductivity-type deep well,
   wherein the second conductivity-type adjusting layer is formed on both the deep well cutout area and the second conductivity-type deep well,
   wherein a thickness of a second conductivity-type epitaxial layer is increased to have a thickness of between approximately 7.5 to 8.0 μm and a width of the deep well cutout area is widened to have a width of between approximately 3 to 5 μm so as to raise a breakdown voltage and the second conductivity-type adjusting layer is added so as to lower an on-resistance of an LDMOS device.

2. The method of claim 1, wherein forming the second conductivity-type deep well comprises:
   performing ion implantation using an impurity.

3. The method of claim 1, wherein forming the second conductivity-type adjusting layer comprises:
   performing ion implantation using an impurity; and then
   performing a diffusion process.

4. The method of claim 1, further comprising, before forming the second conductivity-type deep well and the second conductivity-type adjusting layer:
   forming a second conductivity-type buried layer on the first conductivity-type semiconductor substrate.

5. The method of claim 1, further comprising, before forming the second conductivity-type deep well:
   forming a first conductivity-type epitaxial layer on the first conductivity-type semiconductor substrate.

6. The method of claim 1, wherein forming the second conductivity-type deep well comprises:
   performing ion implantation using arsenic.

7. The method of claim 1, wherein forming the second conductivity-type adjusting layer comprises:
   performing ion implantation using phosphorous.

8. The method of claim 1, wherein forming the first conductivity-type body comprises:
   performing ion implantation using boron using a photoresist; and then
   performing a hard bake process without removing the photoresist; and then
   performing ion implantation using arsenic.

9. An apparatus comprising:
   a first conductivity-type semiconductor substrate having an active area and a field area;
   a second conductivity-type deep well formed on the first conductivity-type semiconductor substrate;
   a second conductivity-type adjusting layer located in the second conductivity-type deep well;
   a first conductivity-type body formed in the second conductivity-type deep well;
   an insulating layer formed on the first conductivity-type semiconductor substrate in the active area and the field area;
   a gate area formed on the first conductivity-type semiconductor substrate in the active area;
   a second conductivity-type source area formed in the first conductivity-type body;
   a second conductivity-type drain area formed in the second conductivity-type deep well; and
   a deep well cutout area formed in the second conductivity type well and under the second conductivity-type source area except under the second conductivity-type drain area
   wherein the second conductivity-type adjusting layer is formed on both the deep well cutout area and the second conductivity-type deep well,
   wherein a thickness of a second conductivity-type epitaxial layer is increased to have a thickness of between approximately 7.5 to 8.0 μm and a width of the deep well cutout area is widened to have a width of between approximately 3 to 5 μm so as to raise a breakdown voltage and the second conductivity-type adjusting layer is added so as to lower an on-resistance of an LDMOS device.

10. The apparatus of claim 9, further comprising a second conductivity-type buried layer formed below the second conductivity-type deep well.

11. The apparatus of claim 9, wherein the deep well cutout area has a width of between 3 to 5 μm.

12. The apparatus of claim 9, wherein the deep well cutout area has a width of 4 μm.

13. The apparatus of claim 9, further comprising a first conductivity-type epitaxial layer formed on the first conductivity-type semiconductor substrate.

14. The apparatus of claim 13, wherein the first conductivity-type epitaxial layer has a thickness of between 7.5 to 8.0 µm.

15. The apparatus of claim 9, wherein the second conductivity-type deep well is formed of arsenic ions.

16. The apparatus of claim 9, wherein the second conductivity-type adjusting layer is formed of phosphorous ions.

17. The apparatus of claim 9, wherein the first conductivity-type body is formed of implanted boron ions and arsenic ions.

18. The apparatus of claim 9, wherein the apparatus comprises the LMDOS device having a breakdown voltage of 100V and an operation voltage of 85V.

* * * * *